United States Patent [19]

Iwasa et al.

[11] 3,969,697
[45] July 13, 1976

[54] VOLTAGE DROP WARNING APPARATUS WITH NEGATIVE-RESISTANCE DEVICE

[75] Inventors: Hitoo Iwasa, Takatsuki; Gota Kano, Nagaoka, both of Japan

[73] Assignee: Matsushita Electric Industrial Co., Ltd., Kadoma, Japan

[22] Filed: Dec. 30, 1974

[21] Appl. No.: 537,392

[52] U.S. Cl. .......................... 340/248 B; 307/235 A
[51] Int. Cl.² ........................................... G08B 21/00
[58] Field of Search .................... 340/248, 253, 249; 328/148; 307/235 R, 235 U, 304, 322, 237, 251, 279, 283, 284, 286, 296

[56] References Cited
UNITED STATES PATENTS

| | | | |
|---|---|---|---|
| 3,379,085 | 4/1968 | Burton | 317/148.5 R |
| 3,537,090 | 10/1970 | Schartmann et al. | 340/248 R |
| 3,603,811 | 9/1971 | Day et al. | 307/304 X |
| 3,737,731 | 6/1973 | Zeewy | 340/248 R X |
| 3,813,664 | 5/1974 | Geyer | 340/248 R |
| 3,854,089 | 12/1974 | Emler | 340/253 C |
| 3,877,001 | 4/1975 | Bogut et al. | 340/249 |

*Primary Examiner*—John W. Caldwell
*Assistant Examiner*—Daniel Myer
*Attorney, Agent, or Firm*—Cushman, Darby & Cushman

[57] ABSTRACT

A series connection comprising a transistor (4) and a light-emitting diode (3) is connected across a D.C. power source (+Vcc), and one end of a negative-resistance device (1) is connected to the base of said transistor (4) and the other end thereof is connected to an end of said light-emitting diode (3), which last-mentioned one end is connected to the D.C. power source (+Vcc). The circuit constituted as above memorizes an occurence of voltage drop which enables bistable switching in the negative-resistance device, thereby energizing the light emitting diode to light. The circuit can be used to indicate voltage lowering or interruption of an A.C. power supply, or weakening of a battery.

4 Claims, 6 Drawing Figures

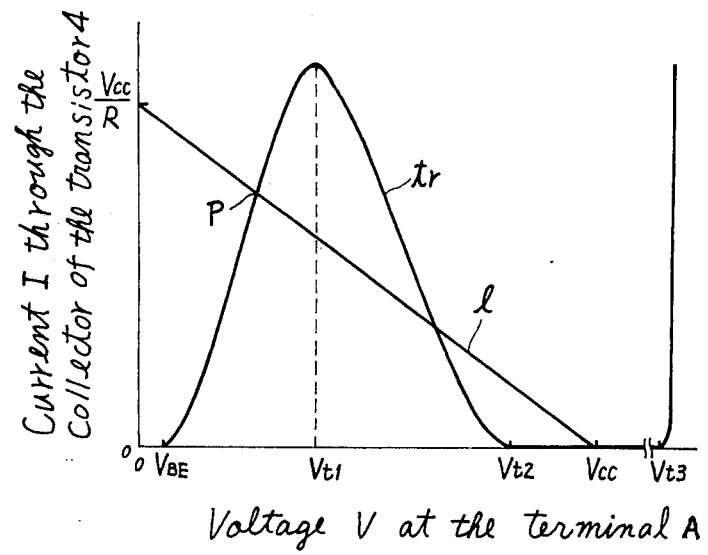
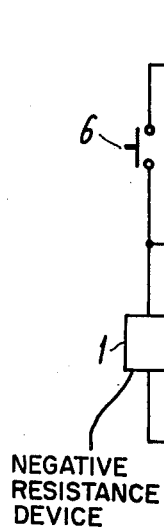
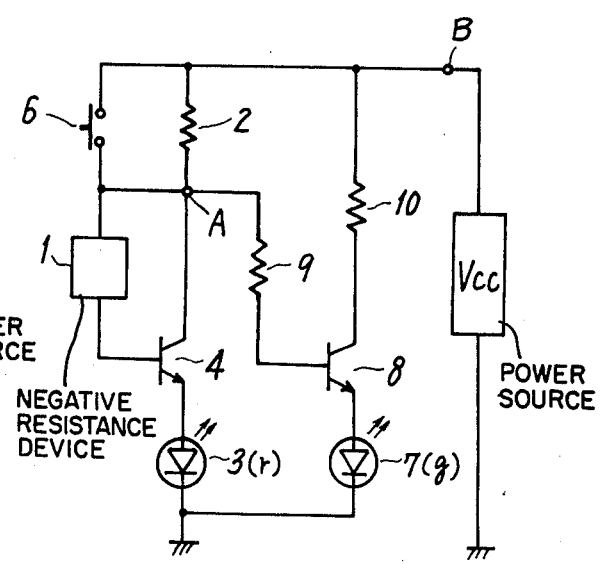

VOLTAGE DROP WARNING APPARATUS WITH NEGATIVE-RESISTANCE DEVICE

BACKGROUND OF THE INVENTION

This invention relates to a voltage drop warning apparatus with negative-resistance device which warns that a voltage drop has occurred or is occurring. More particularly, this invention concerns a voltage drop indicator which is capable of indicating that a voltage drop has once occurred or is now occurring, through an indication by a light-emitting diode, etc.

In electronic digital clocks or electric clocks operating with an A.C. electric power source supply, by means of synchronization with the frequency of the A.C. power source the time measurement is very accurate. However, in such electronic or electric clocks operating with the A.C. power source, once the power supply is interrupted or disturbed, the time lags behind forever even after restoration from the interruption or disturbance, and moreover, the user usually does not become aware of the time lag.

In electronic digital clocks or electric clocks operating with a D.C. power source as, for instance, a dry cell, when the power source becomes weak and lowers its output power below a specified threshold level, the time becomes inaccurate. In order to check such weakening of the power source, any known voltage indication devices such as a light-emitting diode, miniature incandescent lamp or ammeter can be used, but power consumption of such a device should be made very low. One proposed device comprises a push-button switch which is closed by pressing for the voltage checking, but such device has a drawback that the indication of lowering voltage is obtainable only when the button is pressed.

SUMMARY OF THE INVENTION

This invention is intended to provide a voltage drop warning apparatus with negative-resistance device which warns of a voltage drop or interruption of a power source.

This invention is applicable for indicating an occurrence of voltage interruption in an A.C. power source after a preset time.

This invention is applicable for indicating an occurrence of voltage lowering in a D.C. power source after a preset time.

This invention is applicable for warning of an occurrence of time lag in an analogue or digital clock or an occurrence of errors in data from a data processing apparatus, so as to avoid inadvertent use of such time lag or erroneous data.

This invention has an advantage that its constitution is very simple dispensing with mechanical devices such as a relay or ammeter, and consumes very small power even for continuous indication.

BRIEF DESCRIPTION OF THE DRAWING

FIG. 4 is a voltage-current characteristic diagram between the terminal A and the ground terminal in FIG. 3 when the switch 5 holds 5b state. A load line 1 of the resistance 2 is also depicted in this figure.

FIG. 5 is a circuit diagram of another example of the present invention, and

FIG. 6 is a circuit diagram of still another example of the present invention.

DETAILED DISCLOSURE OF THE INVENTION

Figure 1:
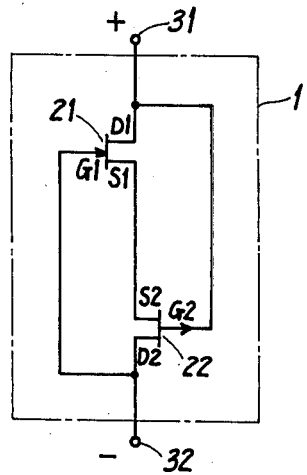
FIG. 1 is a circuit diagram of a negative-resistance device used in the apparatus of the present invention.

Prior to description of the apparatus of the present invention, a negative-resistance device for use in the apparatus of the present invention is elucidated referring to FIG. 1.

FIG. 1 shows a circuit example as disclosed in prior art, for example IEEE Transactions on Circuit Theory, March 1963, pages 25–35 and Proceedings of The IEEE, April 1965, page 404.

In FIG. 1, the gate electrode G1 of an n-channel type FET 21 is connected to the drain electrode D2 of a p-channel type FET 22, and the gate electrode G2 of the p-channnel type FET 22 is connected to the drain electrode D1 of the n-channel type FET 21. Both source electrodes S1 and S2 of both FETs 21 and 22 are further series-connected to each other.

Figure 2:
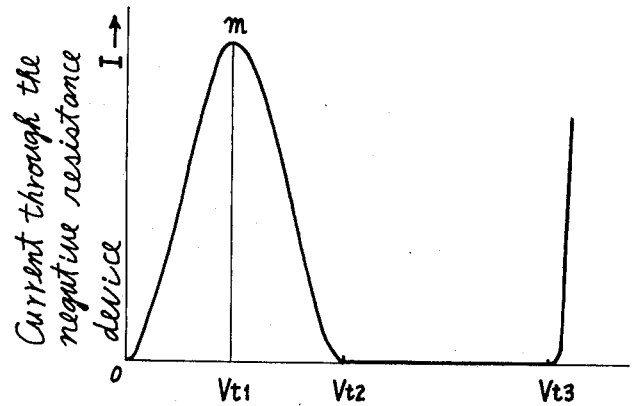
FIG. 2 is a diagram showing the voltage-current characteristic of the negative-resistance device shown in FIG. 1.

When a voltage V is applied across two outer terminals 31 and 32, i.e., across one drain electrode D1 and the other drain electrode D2 of the series-connected pair of FETs F1 and F2 (with positive potential on the side of electrode D1), a known current-voltage characteristic as shown in FIG. 2 is obtained between voltage V and source current I. As is seen in FIG. 2, for a time from the starting voltage O, the current I increases showing positive resistance characteristic as the voltage increases, but the current also shows gradually a saturation characteristic, and after the current exceeds the voltage of the peak current point $m$, (i.e., the first threshold voltage $Vt1$), namely in the region between $Vt1$ and $Vt2$, the current declines as the voltage increases, showing a so-called negative-resistance characteristic. Finally, when the voltage exceeds the second threshold voltage $Vt2$, the current I enters the cut-off state. This cut-off state of the current continues until the voltage reaches a break-over voltage $Vt3$ where one of the FETs begins to break-down. When the voltage passes over the $Vt3$ point, a break-down current is produced. In the circuit of FIG. 1, there are the first stable "ON" region of $0<V \leq Vt1$, the second stable "OFF" region of $Vt2 \leq V<Vt3$, and the unstable state which lies in the applied voltage range of $Vt1<V<Vt2$.

Figure 3:
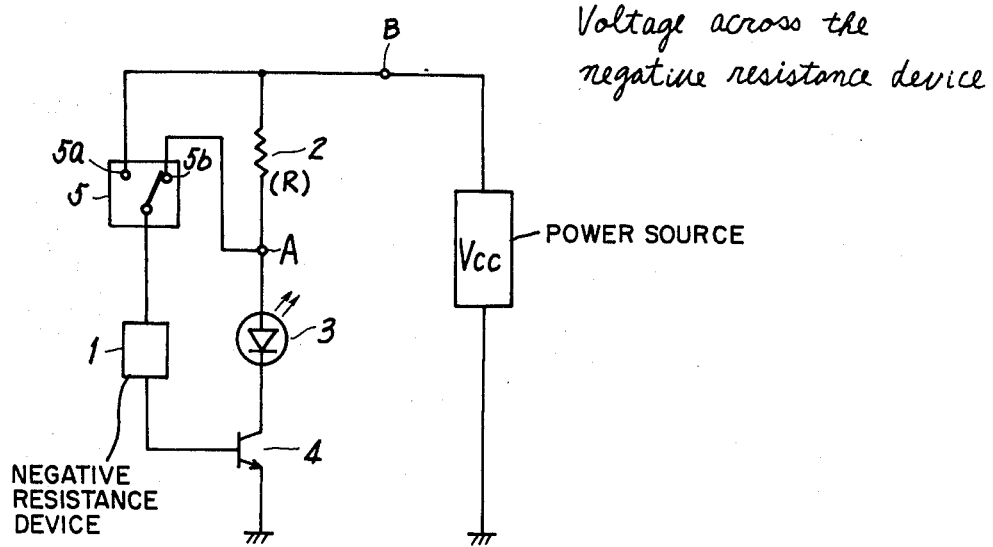
FIG. 3 is a circuit diagram of the apparatus for voltage-drop warning apparatus with negative-resistance device according to the present invention.

FIG. 3 shows a first example of the voltage drop warning apparatus according to the present invention, wherein a terminal B is to be connected to a D.C. voltage supply, for instance, a rectifier circuit operated by commercial A.C. power supply source. A voltage Vcc fed to the terminal B is selected to be a voltage between the voltages $Vt2$ and $Vt3$. A load resistor 2, a light-emitting diode 3 and collector-emitter of a transistor 4 are connected in series together across the D.C. power source Vcc. One end of a negative-resistance device 1 is connected through a contact 5a of a change-over switch 5 to the positive terminal B. The other end of the negative-resistance device 1 is connected to the base of the transistor 4. A normal-closed contact 5b is connected to the junction point A between the load resistor 2 and the light-emitting diode 3.

Operation of the circuit of FIG. 3

First, the switch 5 is changed over to the side of the normal-open contact 5a; accordingly, a voltage Vcc is directly applied to the negative-resistance device, bringing the operating point of the negative-resistance device to the point $V=Vcc$, $I=0$, in order to reset the current to zero.

Then, the switch 5 is changed back to the side of the normal-closed contact 5b, in order to wait for a voltage interruption to be indicated.

1. When no interruption of the voltage occurs. Since the transistor 4 is OFF on account of the zero current in the negative-resistance device caused by the resetting, the source voltage Vcc is applied to the negative-resistance device 1. Therefore the operation point in FIG. 4 is at the point $V=Vcc$, $I=0$. Thus, the base current of the transistor 4 is zero and accordingly the light-emitting diode 3 remains OFF.

2. When an interruption of the voltage occurs. As abovementioned, the negative-resistance device is already reset by changing over the switch 5 to the normal-open contact 5a. By the interruption of the voltage at the terminal B, the voltage across both ends of the negative-resistance device becomes zero, so that the voltage on the abscissa of FIG. 4 is brought to the point $V=0$, $I=0$, and the transistor 4 is OFF.

Then, as the voltage supply restores, the D.C. voltage at the terminal B increases to the voltage Vcc. On account of this voltage increase, for a voltage exceeding $V=V_{BE}$, at the terminal B, the transistor 4 is turned ON. Therefoe, a current flows from the terminal B, through the resistor 2, the switch 5, the negative-resistance device 1, the base and the emitter of the transistor 4 to the ground. Thus, when the source voltage at the terminal B exceeds the specified voltage $V_{BE}$, the light-emitting diode 3 is lit. Then, as the source voltage increases the current through the negative-resistance device 1 increases along the positive gradient part of the characteristic curve of the negative-resistance device 1, and accordingly, the collector current which is $h_{FE}$ times as large as that of the base current, of the transistor 4, increases.

The resistance R of the load resistor 2 should be selected with such a value that the oblique line "1" connecting the point $V=0$, $I=Vcc/R$ and the point $V=Vcc$, $I=0$, representing the load resistance R in FIG. 4, crosses at the point P in the positive gradient part of the characteristic curve of the negative-resistance device, i.e., the part of the curve in the range between the voltages of $V_{BE}$ and $Vt1$. By means of the abovementioned selection of the resistance R, even when the voltage at the point B reaches to the value Vcc, the current flowing in the negative-resistance device remains stable at the value represented by the cross point P, and the light-emitting diode 3 is lit with this steady current. This lighting of the light-emitting dioe indicates that the voltage at the terminal B has interrupted, thus warning the user of inaccuracy of the data processed or the time indicated after such accident.

Resetting the circuit

After the negative-resistance device is turned ON and the transistor is turned ON, when the indication is confirmed by the user, the user must reset the circuit to detect another voltage drop in the future. Such resetting is made by applying the source voltage Vcc across the negative-resistance device 1 by changing over the switch 5 to the side of the normal-open contact 5a. By such application of the electromotive force Vcc, the operating point of the negative-resistance device is brought to a state represented by $V=Vcc$, $I=0$ in FIG. 4, wherein the transistor 4 is shut OFF through elimination of its base current thereby extinguishing the light-emitting diode 3.

Indication of Battery Weakening

The apparatus of FIG. 3 is also capable of indicating the weakening of a dry cell or battery. For such indication, the condition of the circuit is selected as:

1. the gradient of the load curve $l$ is almost equal to the gradient of the curve between the voltages $Vt1$ and $Vt2$ of the characteristic curve $tr$ for the Negative-resistance device shown in FIG. 4; and
2. the electromotive force Vcc for normal state of the dry cell or the battery slightly exceeds the voltage $Vt2$.

When the battery or the dry cell is normal, the oblique load curve $l$ does not cross the curve $tr$, and the operating point is $V=Vcc$, $I=0$. Accordingly, no base current and, hence no collector current, flows in the transistor 4.

Then, when the dry cell or the battery becomes weak, and accordingly the voltage Vcc at the terminal B becomes lower than $Vt2$, the oblique load line $l$ crosses the curve $tr$ in the region between $V_{BE}<V<Vt1$. Therefore, the operating point becomes stable at a cross point, and the collector current of the transistor 4 represented by the current value for the cross point flows through the light-emitting diode 3 and energizes it.

FIG. 5 shows another example of the present invention, wherein a resetting means is a spring biased push-button switch 6 which is connected between the positive-power supply terminal B and the negative-resistance device, and the junction point between the switch and the negative-resistance device is directly connected to the junction point A between the resistor 2 and the light-emitting diode 3. Other parts are identical with the example of FIG. 3. The resetting is made by simply pressing, hence closing, the switch 6 for a short time. By means of this closing of the switch 6, the power supply voltage Vcc is applied to the negative-resistance device, and the circuit is reset in the same way as ellucidated referring to FIG. 3. This example is easier in handling the resetting switch, since the resetting switch 6 is of self-restoring nature, and therefore, there is no fear of forgetting to return the resetting switch to the normal operating position.

FIG. 6 shows still another example of the present invention, wherein a pair of light-emitting diodes, for instance, a red-emitting LED 3 and a green-emitting LED 7 are used. The red-emitting LED 3 is connected in a manner similar to FIG. 5, but the order of the transistor 4 and the light-emitting diode 3 is reversed. A second transistor 8 is connected by its emitter to the green-emitting LED 7, by its collector via a resistor 10 to the positive-power source terminal B, and by its base via a resistor 9 to the junction point A between the collector of the first transistor 4 and load resistor 2.

Operation of FIG. 6 is as follows:

First the circuit is reset by a resetting switch 6, in a similar way to the previous examples. When the potential at the point A, which is between the collector of the transistor 4 and the load resistor 2, is higher than $Vt2$ in FIG. 4, the negative-resistance device, hence, the first transistor 4, is OFF. Accordingly, a current flows through the resistors 2 and 9 into the base of the second transistor 8, making it ON, hence, lighting the light-emitting diode 7 on. Therefore, this green light indication indicates that the power source Vcc has been and is in order.

When an interruption takes place in the power supply and the potential at the terminal B falls below V$t2$, or further to zero and later is restored to the voltage Vcc, then the negative-resistance device becomes ON, in a manner as already mentioned in above in referring to FIGS. 2, 3 and 4, hence, turning the first transistor 4 ON with the collector current represented by the point P in FIG. 4 and lighting the red light-emitting diode 3. This red light indication indicates that the power source Vcc has been interrupted or the voltage lowered. When the red light is lit, the potential at the point A becomes low, and therefore, the transistor 8 is turned OFF, extinguishing the green light-emitting diode 7.

Thus, in the circuit of FIG. 6, the lighting of only the green light indicates normal supplying of the power source, the lighting of only the red light indicates a past interruption of the power source, and extinguishing of both green and red lights indicates a negative going interruption of the power source.

PRACTICAL DATA OF THE EXAMPLES

Example of FIG. 5

Negative-resistance device 1 consists of complementary FETs of an n-channel junction-type FET and a p-channel junction-type FET connected in the manner shown in FIG. 1, wherein V$t1$ — 3V
V$t2$ — 7V
V$t3$ — 22V.

Light-emitting diode 3 is a red-light emitting diode made of a $GaAs_{0.6}P_{0.4}$ crystal.

Transistor 4 is an npn-silicon planar transistor having D.C. current amplification factor $h_{FE}$ of approximately 100.

D.C. power source Vcc supplies 10V D.C. current.

The apparatus works appropriately as abovementioned with the load resistance selected in a range of 400Ω to 1000Ω.

Example of FIG. 6

Negative-resistance device 1 consists of complementary FETs of an n-channel junction-type FET and a p-channel junction-type FET connected in the manner shown in FIG. 1, wherein V$t1$ — 1.0V
V$t2$ — 2.5V
V$t3$ — 28V.

Light-emitting diode 3 is a red-light emitting diode made of a $GaAs_{0.6}P_{0.4}$ crystal.

Light-emitting diode 7 is a green-light emitting diode made of a GaP crystal.

Transistors 4 and 8 are np-n-silicon planar transistor having D.C. current amplification factor $h_{FE}$ of approximately 200.

D.C. power source Vcc supplies 5V D.C. current.

The apparatus works appropriately as abovementioned with the resistance of the resistor 2 — 150Ω,
the resistance of the resistor 9 — 33KΩ and
the resistance of the resistor 10 — 150Ω.

In embodying the present invention, the circuit constitution is not confined to the circuit exemplified in the abovementioned examples, and any variation within the scope of the present invention can be made. For instance, in the example of FIG. 3, the light-emitting diode 3 can be connected on the upper side of the point A, for instance, between the point B and the resistor 2, instead of on the lower side shown in FIG. 3.

Also, the light-emitting diodes 3 can be replaced by other warning means, for instance, a buzzer or incandescent lamp.

Further, a Darlington-Connection circuit having two transistors can be used in place of the transistor 4 or 8, if a large output is required.

The negative-resistance device 1 can comprise an insulated gate type (so-called MOS type) FET instead of the junction type FET shown in the examples.

As is elucidated in the above, according to the present invention, an interruption or lowering of commercial power supply or a weakening of a D.C. power source is indicated to the user of an electric or electronic appliances, such as clock or data processor, and therefore, erroneous usage of such time or data after a power source failure can be prevented.

The apparatus of the present invention is simple in circuit constitution. In the examples of FIGS. 3 and 5, the circuit has the advantage of substantially zero power consumption.

Detection of the weakening of the battery can be simply made by connecting the apparatus of the present invention to the battery.

What is claimed is:
1. A voltage-drop warning apparatus comprising:
   a series connection including a load, an indication means and a semiconductor switching element, both ends of the series connection being connected across positive and negative ends of a power source, and
   a negative-resistance device comprising a complementary connection of an n-channel field-effect transistor and a p-channel field-effect transistor, one end of the negative-resistance device being connected to a junction point between said load and the switching element, and the other end of said device being connected to a control-signal input-terminal of the switching element.
2. A voltage-drop warning apparatus according to claim 1, further comprising a resetting means, which for a specified period, applies a voltage across said negative-resistance device that turns said negative-resistance device OFF.
3. A voltage-drop warning apparatus according to claim 1, further comprising a second semiconductor switching element connected by its input-terminal to an output terminal of said first switching element, and a second indication means connected in series with said second switching element.
4. A voltage-drop warning apparatus according to claim 2, further comprising a second semiconductor switching element connected by its input-terminal to an output terminal of said first switching element, and a second indication means connected in series with said second switching element.

* * * * *